US007796156B2

(12) United States Patent
Lee

(10) Patent No.: US 7,796,156 B2
(45) Date of Patent: Sep. 14, 2010

(54) ORGANIC ELECTROLUMINESCENT DISPLAY PANEL TESTING APPARATUS AND METHOD THEREOF

(75) Inventor: I-Shu Lee, Taoyuan (TW)

(73) Assignee: AU Optronics Corp., Hsinchu (TW)

( * ) Notice: Subject to any disclaimer, the term of this patent is extended or adjusted under 35 U.S.C. 154(b) by 1181 days.

(21) Appl. No.: 11/403,346

(22) Filed: Apr. 12, 2006

(65) Prior Publication Data

US 2007/0152672 A1 Jul. 5, 2007

(30) Foreign Application Priority Data

Dec. 20, 2005 (TW) .............................. 94145222 A

(51) Int. Cl.
*H04N 17/00* (2006.01)
*G01R 31/00* (2006.01)

(52) U.S. Cl. ......................... 348/189; 348/180; 345/45; 324/770

(58) Field of Classification Search ................. 348/189, 348/180, 184; 324/403, 408, 409, 770; 438/17, 438/18, 28; 345/204, 90, 45, 46
See application file for complete search history.

(56) References Cited

U.S. PATENT DOCUMENTS 6,946,307 B2 * 9/2005 Shih ............................ 438/17
7,106,089 B2 * 9/2006 Nakano et al. .............. 324/770
7,122,970 B2 * 10/2006 Ono et al. ................ 315/169.3
2004/0095301 A1 5/2004 Shih ............................ 345/84
2004/0246019 A1 12/2004 Nakano et al. .............. 324/770

FOREIGN PATENT DOCUMENTS

CN 1573341 2/2005
TW I220694 9/2004

* cited by examiner

*Primary Examiner*—David L Ometz
*Assistant Examiner*—Jean W Désir
(74) *Attorney, Agent, or Firm*—J.C. Patents

(57) ABSTRACT

An apparatus for testing an organic electroluminescent display panel having a plurality of data and scan lines comprises a detecting control circuit, a gate de-multiplexer and a source de-multiplexer. The detecting control circuit generates a gate test signal and a source test signal respectively to the gate de-multiplexer and the source de-multiplexer according to the position coordinate of a testing pixel in the organic electroluminescent display panel. The gate de-multiplexer and the source de-multiplexer send a gate testing voltage and a source testing voltage to one of the scan lines and one of the data lines respectively according to the gate and source test signals. In addition, the detecting control circuit further records an output voltage of the testing pixel.

12 Claims, 6 Drawing Sheets

ORGANIC ELECTROLUMINESCENT DISPLAY PANEL TESTING APPARATUS AND METHOD THEREOF

CROSS-REFERENCE TO RELATED APPLICATION

This application claims the priority benefit of Taiwan application serial no. 94145222, filed on Dec. 20, 2005. All disclosure of the Taiwan application is incorporated herein by reference.

BACKGROUND OF THE INVENTION

1. Field of the Invention

The present invention relates to an apparatus for testing a display panel and a method thereof. More particularly, the present invention relates to an apparatus for testing an organic electroluminescent display panel and a method thereof.

2. Description of Related Art

Along with the advancement of information technology, various information devices, such as computers, mobile telephones, personal digital assistants (PDA), and digital cameras are continuously being developed. Displays always play an important role in information devices, and flat panel displays have gradually become popular for their features of thinness, lightweight, and power saving.

Among various flat panel displays, the Active Matrix Organic Electroluminescent Diode (abbreviated as AMOLED below) display is popularly applied in portable electronic products, such as notebooks, PDAs, and mobile telephones, and especially large-scale display units, such as televisions and monitors, because of the advantages of wide view angle, high quality color contrast, lightweight, thinness, high response speed, low cost, and so on.

In the present technology for fabricating an AMOLED panel, first a plurality of thin film transistors is formed on a substrate, i.e., an active thin film transistor array substrate is used to fabricate a pixel circuit, and then an organic electroluminescent material is evaporated. However, if the pixel circuit on the substrate has defects before the organic electroluminescent material is evaporated, the yield of the AMOLED is reduced. Since the organic electroluminescent material is quite expensive, therefore it is important to ascertain that the pixel circuit functions properly before the organic electroluminescent material is evaporated to avoid wasting the organic electroluminescent material.

SUMMARY OF THE INVENTION

Accordingly, one object of the present invention is to provide an apparatus for testing an organic electroluminescent display panel, which can be used to detect whether a pixel circuit functions properly before an organic electroluminescent material, for example, is evaporated on the organic electroluminescent display panel.

Another object of the present invention is to provide a method for testing an organic electroluminescent display panel, wherein a pixel circuit on the organic electroluminescent display panel can be detected point by point or a specific pixel circuit, before an organic electroluminescent material is formed on the organic electroluminescent display panel.

The present invention provides an apparatus for testing an organic electroluminescent display panel having multiple data and scan lines. The testing apparatus comprises a detecting control circuit, a gate de-multiplexer and a source de-multiplexer. The detecting control circuit generates a gate test signal and a source test signal respectively to the gate de-multiplexer and the source de-multiplexer according to the position coordinate of a pixel circuit in the organic electroluminescent display panel. The gate de-multiplexer and the source de-multiplexer send a gate testing voltage and a source testing voltage to one of the scan lines and one of the data lines respectively according to the gate and source test signals. In addition, the detecting control circuit records an output voltage of the pixel circuit as the reference to determine whether or not the pixel circuit functions normally.

In one preferred embodiment of the present invention, the organic electroluminescent display panel further comprises a level translation circuit for receiving the output voltage of the pixel circuit. When the output voltage of the pixel circuit is lower than a reference voltage, the level translation circuit generates a low level detecting signal to the detecting control circuit. Otherwise, the level translation circuit generates a high level detecting signal to the detecting control circuit.

In one preferred embodiment of the present invention, the detecting control circuit comprises an input processor and a clock generator, wherein the input processor is used to receive data input by a user. In one preferred embodiment, the information an input by the user comprises an actuating signal, a position coordinate of a pixel circuit, a resolution information of an organic electroluminescent display panel, and so on. When the input processor receives the data input by the user, the clock generator generates a clock signal to a first counter according to an output of the input processor. The first counter counts the clock signal and generates a first count value, wherein the first count value is used to represent the Column coordinate of each pixel circuit in the organic electroluminescent display panel. The first counter sends the first count value to a comparator and a decision circuit. The comparator compares the first count value with a reference value, wherein the reference value is the number of data lines in the organic electroluminescent display panel. Then, the comparator sends the comparison result to a second counter, such that the second counter generates a second count value according to the output of the comparator. When the first count value is greater than the reference value, the second counter adds 1 to the second count value, wherein the second count value is the row coordinate of each pixel circuit in the organic electroluminescent display panel. Additionally, the decision circuit receives the first and second count values to determine whether or not the first and second count values are consistent with the coordinates of the pixel circuit input by the user. When the decision circuit determines that the first and second count values are consistent with the column and row coordinates of the pixel circuit input by the user, a test signal generating circuit is controlled to generate a source test signal and a gate test signal respectively, thereby testing the pixel circuit.

Furthermore, the detecting control circuit further comprises a record unit for receiving the output of the level translation circuit. When the level translation circuit outputs a low level detecting signal, the record unit records the column and row positions of the pixel circuit under test.

From another embodiment of the invention, a method for testing an organic electroluminescent display panel is provided. First, a gate testing voltage is generated to one of the scan lines in the organic electroluminescent display panel and then a source testing voltage is generated to one of the data lines in the organic electroluminescent display panel to test at least one pixel circuit in the organic electroluminescent display panel. Next, the output voltage of the pixel circuit is detected, wherein when the output voltage of the pixel circuit is lower than a reference voltage, the column and row coordinate positions of the pixel circuit under test is recorded.

In one preferred embodiment of the present invention, the method for testing an organic electroluminescent display panel further comprises initializing the organic electroluminescent display panel and detecting the resolution of the organic electroluminescent display panel. At the same time, a test mode may be selected to test the organic electroluminescent display panel, wherein the test mode includes a point-by-point test mode and a specific pixel circuit test mode.

According to an embodiment of the present invention, the scan and data lines coupled to the tested pixel circuit are used to input the gate and source testing voltages, and the output voltage value of the pixel circuit is detected. Therefore, according to the present invention, whether or not each pixel circuit in the organic electroluminescent display panel has defects may be determined before the organic electroluminescent material is formed on the organic electroluminescent display panel.

In order to make aforementioned and other objects, features and advantages of the present invention comprehensible, a preferred embodiment accompanied with figures are described in detail below.

It is to be understood that both the foregoing general description and the following detailed description are exemplary, and are intended to provide further explanation of the invention as claimed.

DESCRIPTION OF EMBODIMENTS

Figure 1:
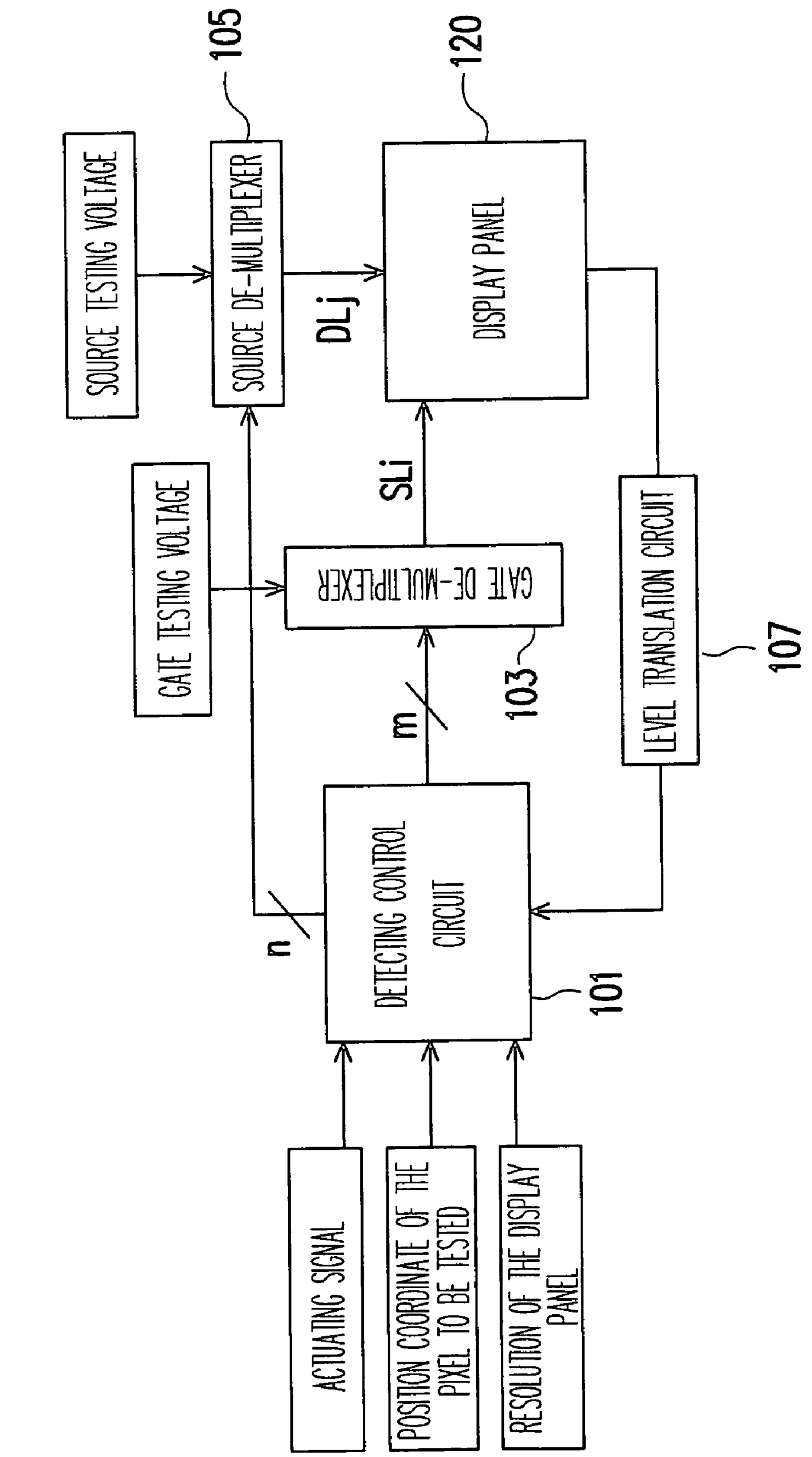
FIG. 1 shows the circuit block diagram of the apparatus for testing an organic electroluminescent display panel according to a preferred embodiment of the present invention.

FIG. 1 is a circuit block diagram of an apparatus 100 for detecting an organic electroluminescent display panel according to the present invention. The apparatus 100 for testing an organic electroluminescent display panel shown in FIG. 1, comprises a detecting control circuit 101 with its output coupled to the gate de-multiplexer 103 and the source de-multiplexer 105. The output of the gate de-multiplexer 103 is coupled to one of scan lines SLi in the organic electroluminescent display panel 120 and the output of the source de-multiplexer 105 is coupled to one of data lines DLj in the organic electroluminescent display panel 120.

The apparatus 100 for testing an organic electroluminescent display panel of the present invention may be applied to test a pixel circuit before forming the organic electroluminescent material in the organic electroluminescent display panel. For testing an organic electroluminescent display, the detecting control circuit 101 sends an m-bit gate test signal to the gate de-multiplexer 103 such that the gate de-multiplexer 103 sends a gate testing voltage to a pixel circuit in the organic electroluminescent display panel 120 through the scan line SLi. Next, an n-bit source test signal is generated to the source de-multiplexer 105 such that the source de-multiplexer 105 sends a source testing voltage to a pixel circuit in the organic electroluminescent display panel 120 through the data line DLj.

Figure 2:
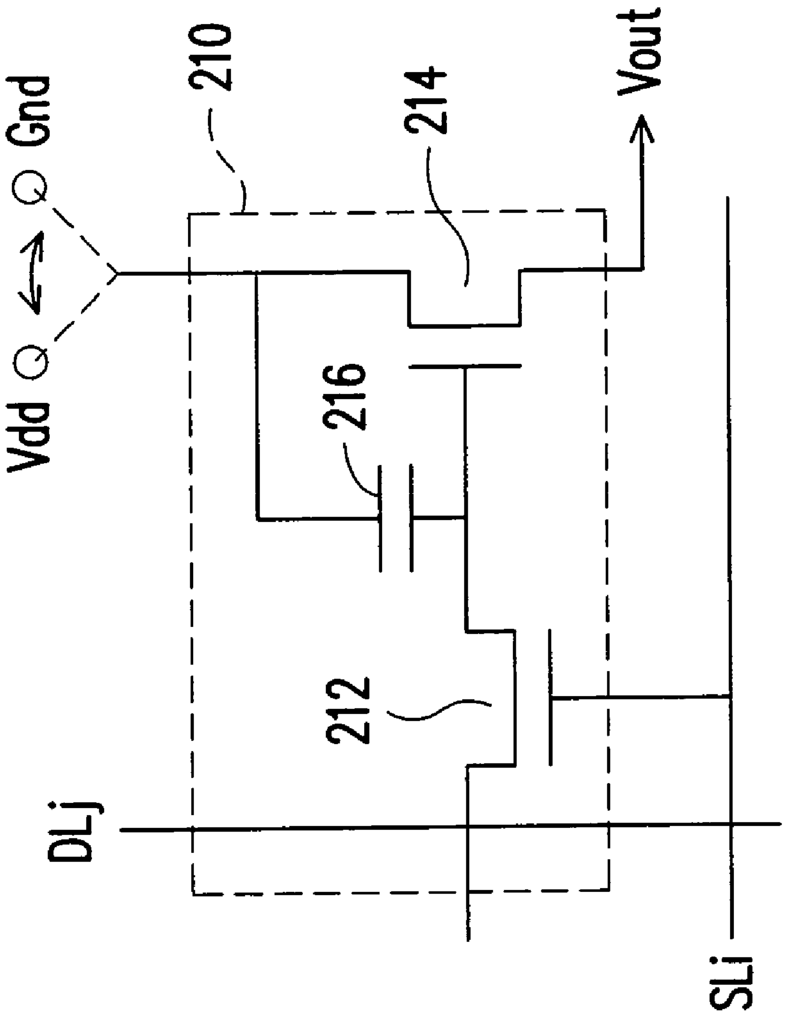
FIG. 2 is a circuit diagram of the pixel circuit where an organic electroluminescent material is not formed.

FIG. 2 shows a circuit diagram of the pixel circuit in an organic electroluminescent display panel where the organic electroluminescent material is not formed. The pixel circuit 210 is disposed between the data line DLj and the scan line SLi. In the embodiment, the pixel circuit 210 comprises a switching transistor 212, a drive transistor 214 and a capacitor 216, wherein the switching transistor 212 and the drive transistor 214 are, for example, thin film transistors. The source of the switching transistor 212 is coupled to the data line DLj, the gate is coupled to the scan line SLi, and the drain is coupled to the gate of the drive transistor 214. Furthermore, the source and gate of the drive transistor 214 are coupled to two terminals of the capacitor, respectively.

FIG. 2 shows a pixel circuit structure having a switching transistor, a drive transistor and a capacitor. It should be noted that those skilled in the art would understand that the present invention is not intended to limit the present invention to such pixel circuit structure. Those skilled in the art would understand that any equivalent pixel circuit structure of the organic electroluminescent display may also be utilized to achieve the purpose of the present invention and is therefore construed to be within scope of the present invention.

Referring to FIGS. 1 and 2, after the detecting control circuit 101 receives an actuating signal input by a user, the organic electroluminescent display panel 120 is initialized. In the embodiment, the source of the drive transistor 214 is coupled to a ground terminal Gnd, so as to completely discharge the capacitor 216, thereby avoid affecting the final measuring result.

Next, the detecting control circuit 101 receives the position coordinate of the pixel circuit to be tested input by a user. Provided that the user will test the pixel circuit 210 in the organic electroluminescent display panel, the detecting control circuit 101 sends an m-bit gate test signal to the gate de-multiplexer 103. And the gate de-multiplexer 103 selects the scan line SLi to input the gate testing voltage according to the gate test signal, thereby turning on the switching transistor 212 in the pixel circuit 210. Next, the detecting control circuit 101 generates an n-bit source test signal to the source de-multiplexer 105. At this point, the source de-multiplexer 105 selects the data line DLj to input the source testing voltage. Thereby, the switching transistor 212 transmits the source testing voltage to the gate of the drive transistor 214, thereby turning on the drive transistor 214. At this time, the source of the drive transistor 214 is coupled to the direct current voltage Vdd.

When the drive transistor 214 is turned on, the voltage difference between the source and the gate of the drive transistor 214 is obtained by the direct current bias Vdd minus the threshold voltage Vth of the drive transistor 214. Therefore, the voltages on two terminals of the capacitor 216 are represented as Vdd-Vth. Provided that the direct current bias Vdd is 12V, the threshold voltage Vth of the drive transistor 214 is 2V. When the drive transistor 214 is turned on, the voltages on the two terminals of the capacitor 216 normally are 10V. Therefore, if the voltage drop between the source and the drain of the transistor is 2V, the output voltage value Vout of the drain is 8V. That is, if the output voltage value Vout is too low and assumed to be 2V, the pixel circuit 210 may have defects.

In another preferred embodiment of the present invention, the panel testing apparatus 100 further comprises a level translation circuit-107 for receiving the output voltage of each pixel circuit 210 in the organic electroluminescent display panel 120. When the output voltage of one tested pixel circuit 210 is smaller than a preset voltage, the level translation circuit outputs a low level detecting signal to the detecting control circuit 101, and then the detecting control circuit 101 records the position of the tested pixel circuit 210 which may have defects. If the output voltage of the tested pixel circuit 210 is not smaller than the reference voltage, the level translation circuit 107 generates a high level detecting signal to the detecting control circuit 101. In the embodiment, the reference voltage is assumed to be 8V.

Figure 3:
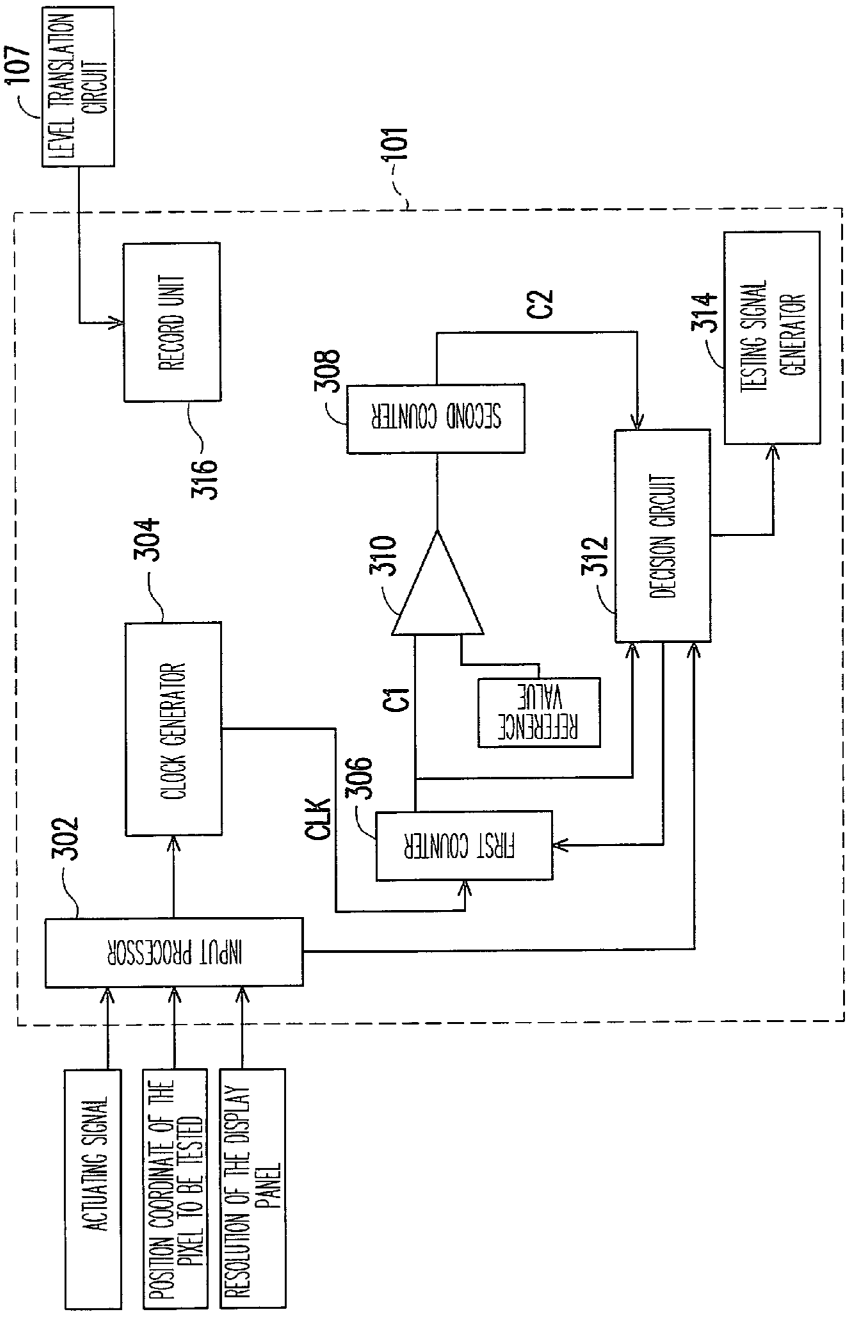
FIG. 3 shows the circuit block diagram of a detecting control circuit according to a preferred embodiment of the present invention.

FIG. 3 is a circuit block diagram of the detecting control circuit 101 according to the present invention. With reference to one preferred embodiment of the detecting control circuit 101 as shown in FIG. 3, the detecting control circuit 101 comprises an input processor 302 for receiving the data input by the user, such as the actuating signal, the coordinate position of the pixel circuit 210 to be tested, and the resolution information of the organic electroluminescent display panel 120. The output of the input processor 302 is coupled to the clock generator 304, and the clock generator 304 sends the output to the first counter 306. The first counter 306 couples the comparator 310 and the decision circuit 312, wherein the comparator 310 receives the output of the first counter 306 and a reference value, and couples the output to the second counter 308. The decision circuit 312 receives the outputs of the first counter 306 and the second counter 308, and controls the test signal generating circuit 314 to generate the gate test signal and the source test signal.

The detecting control circuit 101 has two test modes namely the point-by-point test mode and the specific circuit 210 test mode, which will be illustrated in detail below.

Figure 4:
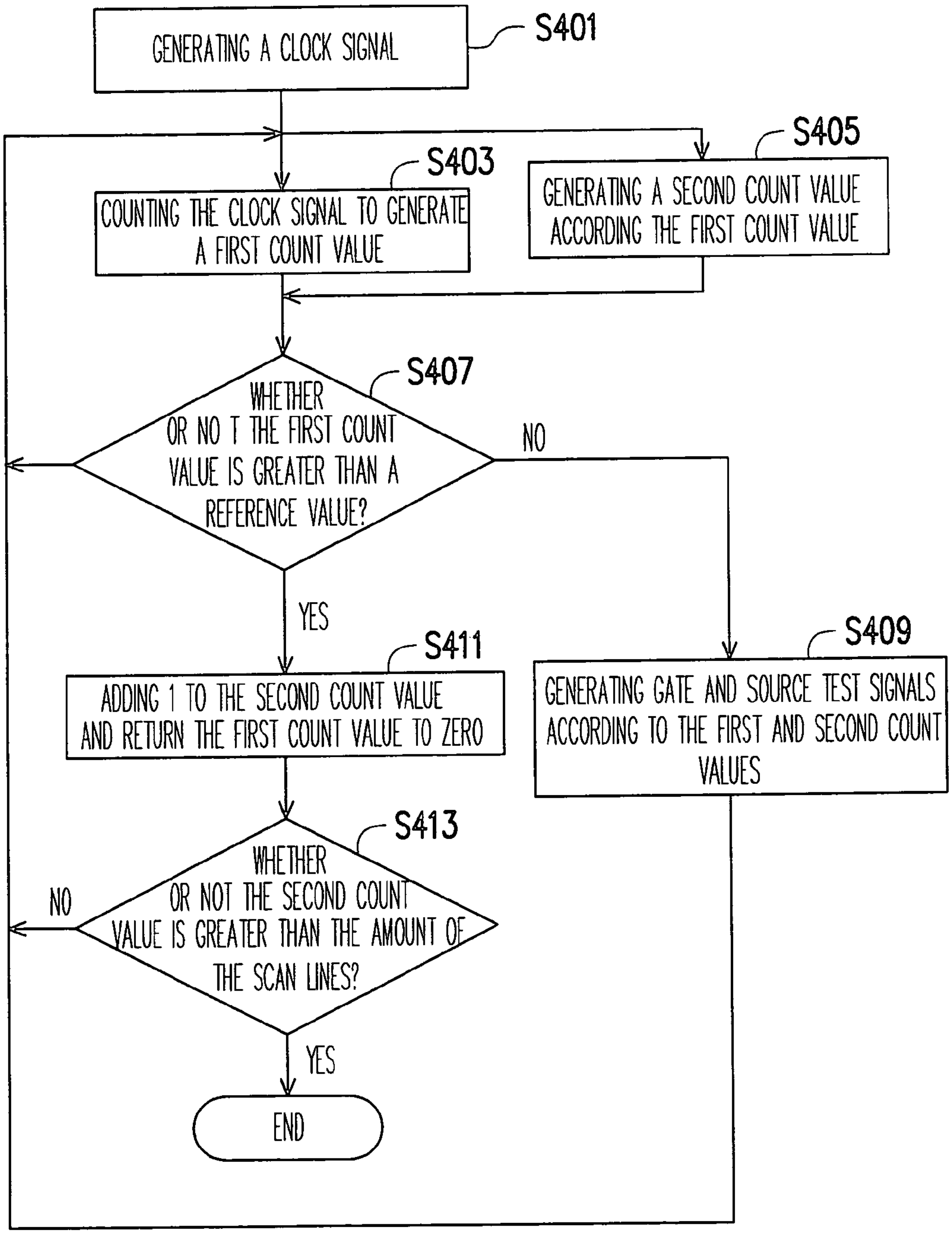
FIG. 4 shows the work flow chart of the detecting control circuit in the point-by-point test mode according to a preferred embodiment of the present invention.

FIG. 4 is a flow chart of the detecting control circuit 101 in the point-by-point test mode according to the present invention. Referring to FIGS. 3 and 4, it is assumed that the detecting control circuit 101 tests the pixel circuit 210 in the organic electroluminescent display panel in the point-by-point test mode. Therefore, after the input processor 302 receives the input of the user, the clock generator 304 is controlled to generate a clock signal CLK to the first counter 306 (Step S401). At this point, the first counter 306 counts the clock signal CLK to generate a first count value C1 to the comparator 310 and the decision circuit 312 (Step S403). Here, according to the first count value C1, the second counter 308 generates a second count value C2 to the decision circuit 312 (Step S405).

In the embodiment, the first count value C1 represents the Column coordinate value of the pixel circuit 210 in the organic electroluminescent display panel, and the second count value C2 represents the Row coordinate value of the pixel circuit 210 in the organic electroluminescent display panel. The source de-multiplexer 105 sends the source testing voltage to a corresponding data line according to the first count value C1, and the gate de-multiplexer 103 sends the gate testing voltage to a corresponding scan line according to the second count value C2.

After the first counter 306 generates the first count value C1 to the comparator 310, the comparator 310 determines whether or not the first count value C1 is greater than the reference value (Step S407), wherein the reference value is the total number of the data lines in the organic electroluminescent display panel 120. If the first count value C1 is not greater than the reference value, i.e., "No" as indicated in Step S407, according to the first count value C1 and the second count value C2, the decision circuit 312 controls the test signal generator 314 to generate a source test signal and a gate test signal to the source de-multiplexer 105 and the gate de-multiplexer 103, respectively (Step S409). Then, the next pixel circuit is tested in sequence starting again from Step S403.

Accordingly, when the first count value C1 is greater than the reference value, i.e., "Yes" as indicated in Step S407, the second counter 308 adds 1 to the second count value C2, and the decision circuit 312 controls the first counter 306 to return the first count value to zero and recount it (Step S411). Then, the decision circuit 312 determines whether or not the second count value C2 is greater than the total number of the scan lines in the organic electroluminescent display panel 120 (Step S413).

When the second count value C2 is not greater than the total number of the scan lines, i.e., "No" as indicated in Step S413, it means that some pixel circuits in the organic electroluminescent display panel 120 haven't been tested. Therefore, the detecting control circuit 101 repeats the operations from Step S403. Accordingly, when the second count value C2 is greater than the total number of the scan lines, i.e., "Yes" as indicated in Step S413, it means that all pixel circuits have been tested, thereby completing the entire work flow.

Figure 5:
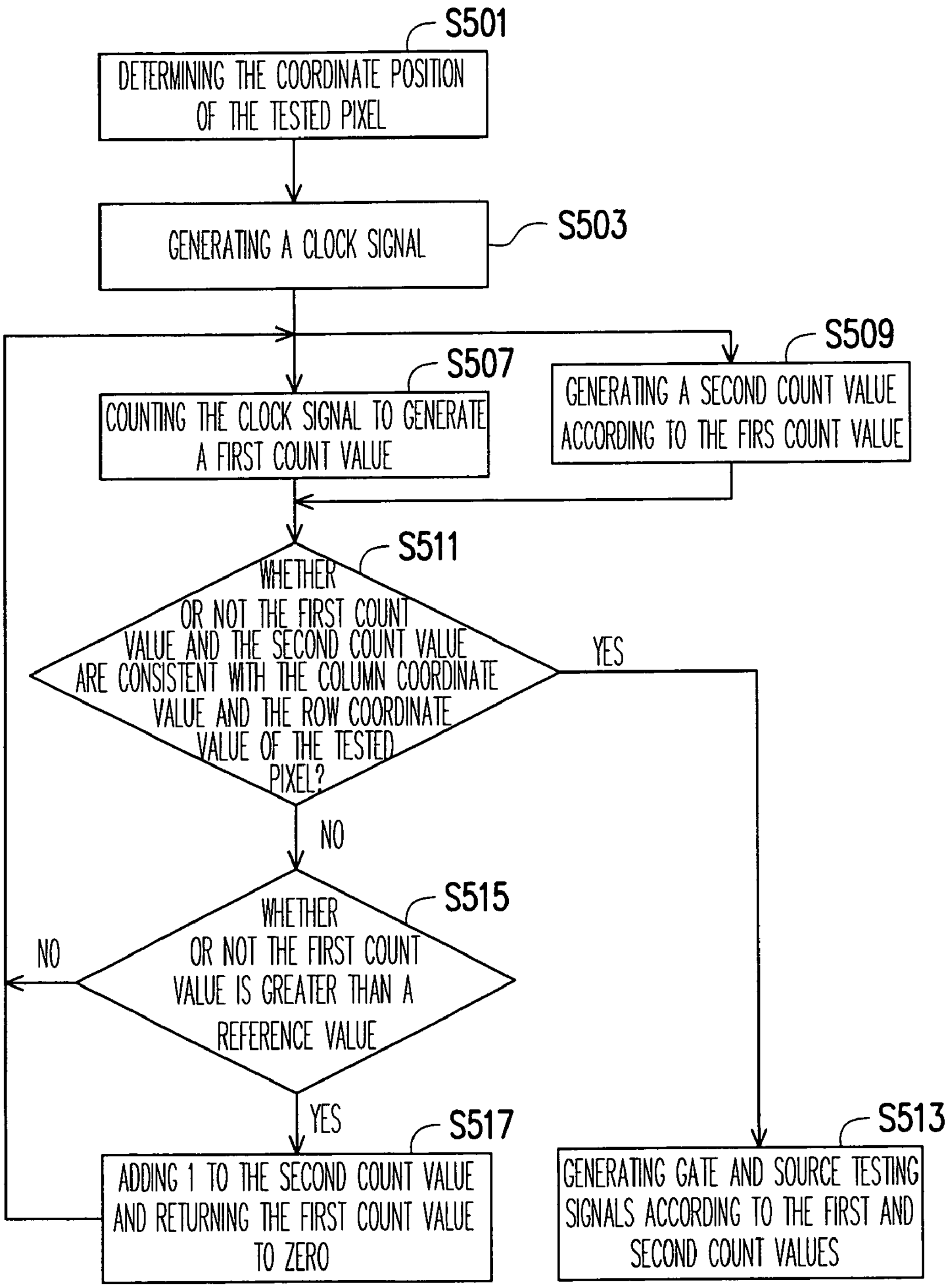
FIG. 5 shows the work flow chart of the detecting control circuit in a specific pixel test mode according to a preferred embodiment of the present invention.

FIG. 5 is a flow chart of the detecting control circuit 101 in a specific pixel circuit test mode according to the present invention. Referring to FIGS. 3 and 5, the detecting control circuit 101 is in a specific pixel circuit test mode. At this time, according to the data input by a user, the input processor 302 determines the coordinate position of the tested pixel circuit 210 in the organic electroluminescent display panel 120 (Step S501). After receiving the coordinate position of the tested pixel circuit 210 decided by the user, the input processor 302 sends the coordinate position to the decision circuit 312, and controls the clock generator 304 to generate a clock signal CLK to the first counter 306 (Step S503).

At this time, the first counter 306 counts the clock signal CLK and generates a first count value C1 to the comparator 310 and the decision circuit 312 (Step S507). At the same time, according to the first count value C1, the second counter 308 generates a second count value C2 to the decision circuit 312 (Step S509). After receiving the first count value C1 and the second count value C2, the decision circuit 312 determines whether the first count value C1 and the second count value C2 are consistent with the coordinate value of the tested pixel circuit 210 input by the user (Step S511). If the first count value C1 and the second count value C2 are consistent with the coordinate value of the tested pixel circuit 210 input by the user, i.e., "Yes" as indicated in Step S511, according to the first count value C1 and the second count value C2, the tested signal generating circuit 314 generates a source test signal and a gate test signal to the source de-multiplexer 105 and the gate de-multiplexer 103, respectively (Step S513).

Accordingly, if the first count value C1 and the second count value C2 are not consistent with the coordinate value of the tested pixel circuit 210 input by the user, i.e., "No" as indicated in Step S511, the comparator 310 determines whether the first count value C1 is greater than the reference value or not (Step S515). If the first count value C1 is not greater than the reference value, i.e., "No" as indicated in Step S515, the detecting control circuit 101 repeats operations from Step S507 again. On the contrary, if the first count value is greater than the reference value C1, i.e., "Yes" as indicated in Step S511, the second counter 308 adds 1 to the second count value C2, and the decision circuit 312 controls the first counter 306 to return the first count value C1 to zero (Step S517). Then, the detecting control circuit 101 repeats operations from Step S507 again.

Referring to FIG. 3, the detecting control circuit 101 further comprises a record unit 316. The record unit 316 is coupled to the level translation circuit 107. When the level translation circuit 107 outputs a low level detecting signal, it means that the present tested pixel circuit 210 may have defects, thus the record unit 316 records the column and row positions of the pixel circuit 210 under test as the reference for defects.

Figure 6:
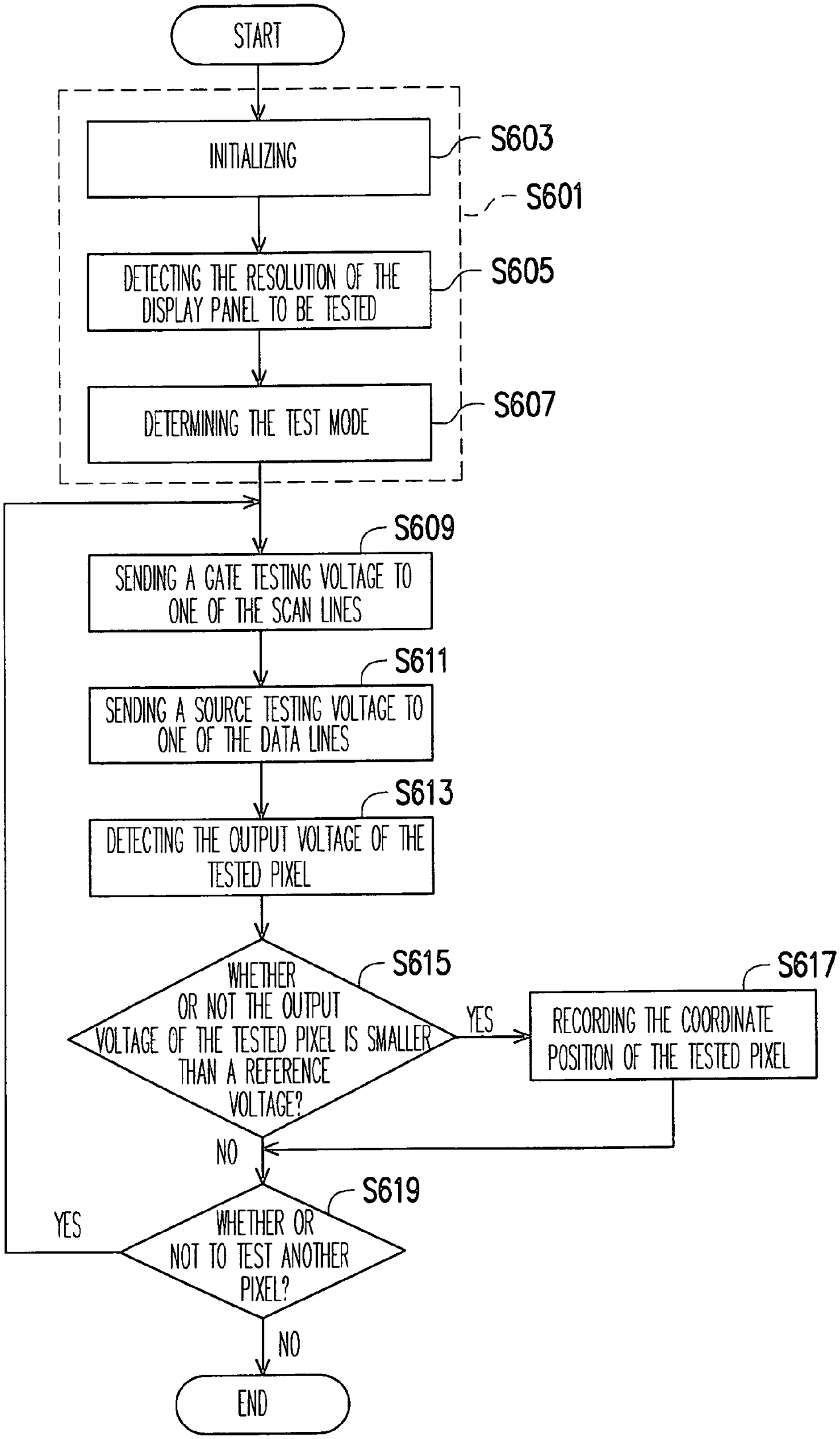
FIG. 6 shows the process flow chart of the method for testing an organic electroluminescent display panel according to a preferred embodiment of the present invention.

In view of the above illustration, FIG. 6 is a process flow chart of the method for testing an organic electroluminescent display according to the present invention. One preferred embodiment of the method for testing the organic electroluminescent display panel is illustrated with reference to FIG. 6. A series of settings are carried out (Step S601) at first, such as initializing (S603), detecting the resolution of the organic electroluminescent display panel to be tested (S605), and deciding the testing modes (S607), wherein the test modes includes the point-by-point test mode and the specific pixel circuit 210 test mode.

After the test mode has been decided, according to the invention, a gate testing voltage is sent to one of the scan lines of the tested organic electroluminescent display panel, thereby allowing all pixel circuits 210 to couple to the scan line (Step S609). Then, a source testing voltage is sent to one of the data line in the organic electroluminescent display panel for testing the corresponding pixel circuit 210, referred to herein as the tested pixel circuit 210, in the organic electroluminescent display panel (Step S611). At this time, according to the present invention, the output voltage of the tested pixel circuit 210 is detected (Step S613), and then whether the voltage of the tested pixel circuit is smaller than a reference voltage or not is determined (Step S615).

If the output voltage value of the tested pixel circuit 210 is smaller than the reference voltage, i.e., "Yes" as indicated in Step S615, it means that the tested pixel circuit 210 may have defects. Therefore, according to the invention, the column and row coordinate positions of the tested pixel circuit 210 are recorded (Step S617). Accordingly, if the output voltage value of the tested pixel circuit 210 is not smaller than the reference voltage, i.e., "No" as indicated in Step S615, it means that the tested pixel circuit 210 is normal.

In the embodiment, after Step S615, according to the two test modes of the present invention, whether or not another pixel circuit 210 is required to be tested is determined (Step S619). If the present invention operates in the point-by-point test mode and if not all the pixel circuits 210 in the organic electroluminescent display panel have been tested, the present invention repeats from Step S609. If all pixel circuits in the organic electroluminescent display panel have been tested in sequence, the entire flow is complete. On the other hand, if the present invention operates in the specific pixel circuit 210 test mode, the mode of carrying out Step S619 is decided according to the input of the user.

In view of the above, since the testing voltage is input through the scan lines and the data lines, according to the present invention, whether or not the pixel circuit 210 has defects is determined through the output voltage of the pixel circuit before an organic electroluminescent material is formed on the organic electroluminescent display panel. Thereby, not only the production yield of the organic electroluminescent display panel is enhanced, but also the wastage of the organic electroluminescent material is reduced. Furthermore, since the present invention provides the point-by-point test mode and the specific pixel circuit 210 test mode, the present invention can be comparatively more comprehensive.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for testing an organic electroluminescent display panel, applicable to testing a pixel circuit in the organic electroluminescent display panel before an organic electroluminescent material is formed on the organic electroluminescent display panel, wherein the organic electroluminescent display panel comprises a plurality of data lines, a plurality of scan lines and a pixel circuit coupling one of the data lines and one of the scan lines, and the pixel circuit comprises a switching transistor, a drive transistor and a storage capacitor, the apparatus comprising:

a gate de-multiplexer, for determining to send a gate testing voltage to one of the scan lines and the pixel circuit according to a gate test signal;

a source de-multiplexer, for determining to send a source testing voltage to one of the data lines and the pixel circuit according to a source test signal; and a detecting control circuit, for generating the gate test signal and the source test signal to the gate de-multiplexer and the source de-multiplexer respectively according to a position coordinate of the pixel circuit in the organic electroluminescent display panel, and recording an output voltage value of the pixel circuit as the reference to determine whether or not the pixel circuit is normal, wherein column and row coordinate positions of the pixel are recorded when the output voltage value of the pixel circuit is smaller than a reference voltage.

2. The apparatus for testing an organic electroluminescent display panel as claimed in claim 1, further comprising a level translation circuit for receiving the output voltage of the pixel circuit, wherein when the output voltage of the pixel circuit is smaller than the reference voltage, the level translation circuit generates a low level detecting signal to the detecting control circuit, and when the output voltage of the pixel circuit is greater than the reference voltage, the level translation circuit generates a high level detecting signal to the detecting control circuit.

3. The apparatus for testing an organic electroluminescent display panel as claimed in claim 2, wherein the detecting control circuit comprises a record unit for receiving the output of the level translation circuit, and when the level translation circuit outputs the low level detecting signal, the record unit records the position of the pixel circuit.

4. The apparatus for testing an organic electroluminescent display panel as claimed in claim 1, wherein the detecting control circuit comprises:

an input processor, for receiving a data input by a user, wherein the data input by the user comprises a actuating signal, a position coordinate of the pixel circuit, and a resolution information of the display panel;

a clock generator, for generating a clock signal according to the output of the input processor;

a first counter, for counting the clock signal and generating a first count value, wherein the first count value represents a column coordinate of the pixel circuit in the organic electroluminescent display panel;

a comparator, for receiving the first count value and comparing the first count value with a reference value, wherein the reference value represents a total number of the data lines;

a second counter, for generating a second count value according to the output of the comparator, wherein when the first count value is greater than the reference value, the second counter adds 1 to the second count value, and the second count value is a row coordinate of the pixel circuit in the display panel;

a decision circuit, for receiving the first count value and the second count value to determine whether the first count value and the second count value are consistent with the column and row coordinates of the pixel circuit input by the user; and a test signal generating circuit, for coupling the decision circuit, wherein when the first count value and the second count value are consistent with column and row coordinates of the pixel circuit input by the user, the test signal generating circuit generates the source test signal and the gate test signal respectively, according to the first count value and the second count value, thereby testing the pixel circuit.

5. The apparatus for testing an organic electroluminescent display panel as claimed in claim 1, wherein the detecting control circuit further comprises a record unit, and when the pixel circuit has defects, the record unit records column and row coordinate positions of the pixel circuit.

6. The apparatus for testing an organic electroluminescent display panel as claimed in claim 1, wherein when the output voltage value of the pixel circuit is smaller than the reference voltage, the pixel circuit is determined to have a defect.

7. A method for testing an organic electroluminescent display panel, applicable to at least one pixel circuit in the organic electroluminescent display panel before an organic electroluminescent material is formed on the organic electroluminescent display panel, wherein the organic electroluminescent display panel comprises a plurality of data lines, a plurality of scan lines and a pixel circuit coupling one of the data lines and one of the scan lines, and the pixel circuit comprises a switching transistor, a drive transistor and a storage capacitor, the method comprising:

generating and sending a gate testing voltage to one of the scan lines;

generating and sending a source testing voltage to one of the data lines for testing the pixel circuit;

detecting an output voltage of the pixel circuit; and recording column and row coordinate positions of the pixel circuit when the output voltage of the pixel circuit is smaller than a reference voltage.

8. The method for testing an organic electroluminescent display panel as claimed in claim 7, further comprising:

initializing the organic electroluminescent display panel;

detecting a resolution of the organic electroluminescent display panel; and deciding a test mode for testing the organic electroluminescent display panel, wherein the test mode comprises a point-by-point test mode or a specific pixel circuit test mode.

9. The method for testing an organic electroluminescent display panel as claimed in claim 8, wherein when it is decided to use the point-by-point test mode and the output voltage of the pixel circuit is not lower than the reference voltage, the steps of generating the gate testing voltage and the source testing voltage are repeated until testing of all pixel circuits in the organic electroluminescent display panel is complete.

10. The method for testing an organic electroluminescent display panel as claimed in claim 8, wherein when it is decided to use the specific pixel circuit test mode, the testing method further comprises:

determining acoordinate position of a specific pixel circuit in the organic electroluminescent display panel;

generating a clock signal;

counting the clock signal and generating a first count value;

generating a second count value according to the first count value;

determining whether the first count value and the second count value are consistent with the column coordinate value and the row coordinate value of the specific pixel circuit;

when the first count value is not consistent with the Column coordinate value of the specific pixel circuit, or the second count value is not consistent with the row coordinate value of the specific pixel circuit, determining whether or not the first count value is greater than a reference value, wherein the reference value is the number of the data lines;

when the first count value is smaller than the reference value, counting of the clock signal is continued;

when the first count value is greater than the reference value, 1 is added to the second count value and the first count value returns to zero, thereby regenerating the first count value;

when the first count value is consistent with the column coordinate value of the specific pixel circuit and when the second count value is consistent with the Row coordinate value of the specific pixel circuit, the source testing voltage and the gate driving voltage are sent to the corresponding scan and data lines of the specific pixel circuit respectively according to the first count value and the second count value;

when the output voltage of the specific pixel circuit is not lower than the reference voltage, whether or not to test another specific tested pixel circuit is determined; and when another specific tested pixel circuit needs to be tested, the steps of generating the first count value and the second count value are repeated.

11. The method for testing an organic electroluminescent display panel as claimed in claim 8, wherein the step of initializing the organic electroluminescent display panel includes completely discharging the organic electroluminescent display panel.

12. The method for testing an organic electroluminescent display panel as claimed in claim 7, wherein when the output voltage of the pixel circuit is smaller than the reference voltage, the pixel circuit is determined to have a defect.

* * * * *